(12) United States Patent
Melanson (10) Patent No.: US 6,738,004 B2
(45) Date of Patent: May 18, 2004

(54) METHOD AND SYSTEM OF INTEGRATING A MISMATCH NOISE SHAPER INTO THE MAIN LOOP OF A DELTA-SIGMA MODULATOR

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/219,362

(22) Filed: Aug. 15, 2002

(65) Prior Publication Data

US 2004/0032355 A1 Feb. 19, 2004

(51) Int. Cl.⁷ .................................................. H03M 3/00
(52) U.S. Cl. ........................ 341/143; 341/144; 341/155
(58) Field of Search ................................ 341/110, 118, 341/120, 143, 144, 145

(56) References Cited

U.S. PATENT DOCUMENTS

| | | | |
|---|---|---|---|
| 5,684,482 A | | 11/1997 | Galton |
| 5,986,595 A | * | 11/1999 | Lyden et al. ............. 341/118 |
| 5,990,819 A | | 11/1999 | Fujimori |
| 6,266,002 B1 | * | 7/2001 | Gong et al. ............. 341/150 |
| 6,426,714 B1 | * | 7/2002 | Ruha et al. ............. 341/143 |
| 6,522,277 B2 | * | 2/2003 | Fujimori et al. .......... 341/144 |
| 6,531,973 B2 | * | 3/2003 | Brooks et al. ........... 341/143 |
| 6,577,257 B2 | * | 6/2003 | Brooks ................... 341/131 |

* cited by examiner

Primary Examiner—Michael Tokar
Assistant Examiner—Linh Van Nguyen
(74) Attorney, Agent, or Firm—Steven Lin, Esq.

(57) ABSTRACT

A method and system for integrating a mismatch noise shaper into the main loop of a delta-sigma modulator are disclosed. The mismatch noise shaper output is fed back to the summer and is responsive to the mismatch noise shaper. At appropriate times, the mismatch noise shaper selectively overrides the quantizer so that the mismatch noise shaper changes output values of the mismatch noise shaper from values representative of a corresponding output value of the quantizer to other values representative of a different output value of the quantizer. The overriding feature distinguishes the present Invention from a DEM, as the output of a DEM is only a reordering of the same number of elements as its input. The mismatch noise shaper selectively overrides the quantizer when the quantizer output has prevented the mismatch noise shaper from controlling selection of elements at the mismatch noise shaper output for a predetermined time period.

32 Claims, 5 Drawing Sheets

FIGURE 1

TABLE 200 FOR EXEMPLARY TWO-ELEMENT MISMATCH NOISE SHAPER 108

| INPUT 107 OF MISMATCH NOISE SHAPER 108 | OUTPUT 109 OF MISMATCH NOISE SHAPER 108 | |
|---|---|---|
| | ELEMENT 1 (E1) | ELEMENT 2 (E2) |
| 0 | 0 | 0 |
| 1 | 1 | 0 |
| 1 | 0 | 1 |
| 2 | 1 | 1 |

METHOD AND SYSTEM OF INTEGRATING A MISMATCH NOISE SHAPER INTO THE MAIN LOOP OF A DELTA-SIGMA MODULATOR

BACKGROUND OF THE INVENTION

Field of Invention

The present invention relates in general to delta-sigma modulators, and in particular, to mismatch noise shapers that are integrated into the main loops of the delta-sigma modulators.

BACKGROUND OF INVENTION

Delta-sigma modulators are particularly useful in digital-to-analog converters ("DACs") and analog-to-digital converters ("ADCs"). The delta-sigma modulator uses oversampling to spread the quantization noise power across the oversampling frequency band, which is typically much greater than the input signal bandwidth. Additionally, the delta-sigma modulator performs noise shaping by acting as a high-pass filter to the noise. Most of the quantization noise power is thereby shifted out of the signal band.

The typical delta-sigma modulator in an ADC includes an input summer which sums the analog input signal with negative feedback, an analog linear (loop) filter, a quantizer, and a feedback loop with a digital-to-analog converter unit (feedback DAC unit) coupling the quantizer output and the inverting input of the input summer. A delta-sigma DAC is similar to the ADC. A delta-sigma DAC has a digital input summer, a digital linear filter, a digital feedback loop, a quantizer, and an output DAC unit at the modulator output. In a first-order modulator, the linear filter comprises a single integrator stage; the filter in higher order modulators normally includes a cascade of a corresponding number of integrator stages. Higher-order modulators have improved quantization noise transfer characteristics over modulators of lower order, but stability becomes a more critical design factor as the order increases. For a given topology, the quantizer can be either a one-bit quantizer or a multiple-bit quantizer.

The feedback DAC unit for multi-bit delta-sigma ADCs and the output DAC unit for a multi-bit delta-sigma DAC are typically constructed from weighted conversion elements (e.g., various DAC elements for a DAC unit). Each conversion element (e.g., DAC element) converts one digital bit into a weighted-step analog voltage or current. The currents or voltages generated by the weighted conversion elements for the digital word being converted are then summed to generate the analog output signal. Mismatch between conversion elements, however, causes the weighted-steps of current or voltage to deviate from their ideal weighted-step values. The deviations may be a result of differences that exist among the conversion elements from the manufacturing or fabrication processes. Element mismatches are the result of mismatch noise and distortion in the output signal. Consequently, dynamic element matching (DEM) circuitry is normally included at the inputs of the conversion elements (e.g., DAC elements), and DEM circuitry spreads the mismatch noise across the analog output signal band.

Various well-known DEM designs exist. Exemplary DEM designs include barrel-shifting, individual level averaging, butterfly routing, and data weighted averaging. DEM circuits, however, do have significant drawbacks. For example, in multiple-bit modulators, the DEM circuitry is relatively large, especially in high voltage ADCs that require a large fabrication geometry. In the case of a delta-sigma DAC, the DEM circuit can often become tonal, thereby adding tonal noise to the output signal. In addition, a tendency for the DEM circuit to become tonal exists, as the DEM circuit is typically a low order, delta-sigma modulator.

A DEM circuit is typically located outside of the main loop of a delta-sigma modulator since mismatch noise is generally not affected by the feedback loop and is not shaped. Thus, the DEM circuit is generally controlled by the output of the quantizer. However, if the quantizer provides an output which does not allow the DEM circuit to variably control and select usage of DAC elements to have certain values for a period of time, then the operation of the DEM circuit to reduce mismatch noise, in effect, becomes nullified.

The present invention recognizes the desire and need for a circuit (e.g., similar to a DEM circuit which shapes mismatch noise) to override the output of the quantizer as appropriate and/or necessary. Particularly, the present invention recognizes this desire and need when the quantizer provides an output which does not allow the DEM circuit to variably control and select usage of DAC elements to have certain values for a period of time. The present invention overcomes the problems and disadvantages that have been encountered with the prior art.

SUMMARY OF INVENTION

The principles of the present invention are generally embodied in a mismatch noise shaper that is integrated into the main loop of a delta-sigma modulator. The quantizer of the delta-sigma modulator provides at least three quantization levels, and the mismatch noise shaper shapes mismatched element usage for the three or more quantization levels. The output of the mismatch noise shaper is fed back to the summer as a feedback signal that is responsive to the mismatch noise shaper. At appropriate times, the mismatch noise shaper selectively overrides the quantizer so that the mismatch noise shaper changes output values of the mismatch noise shaper from values representative of a corresponding output value of the quantizer to other values representative of a different output value of the quantizer. The overriding feature distinguishes the present invention from a DEM, as the output of a DEM is only a re-ordering of the same number of elements as its input. The mismatch noise shaper selectively overrides the quantizer when the output of the quantizer has prevented the mismatch noise shaper from controlling selection of elements at the output of the mismatch noise shaper for a pre-determined time period.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment(s) depicted in FIGS. 1 to 6 of the drawings, in which like numbers designate like parts.

Figure 1:
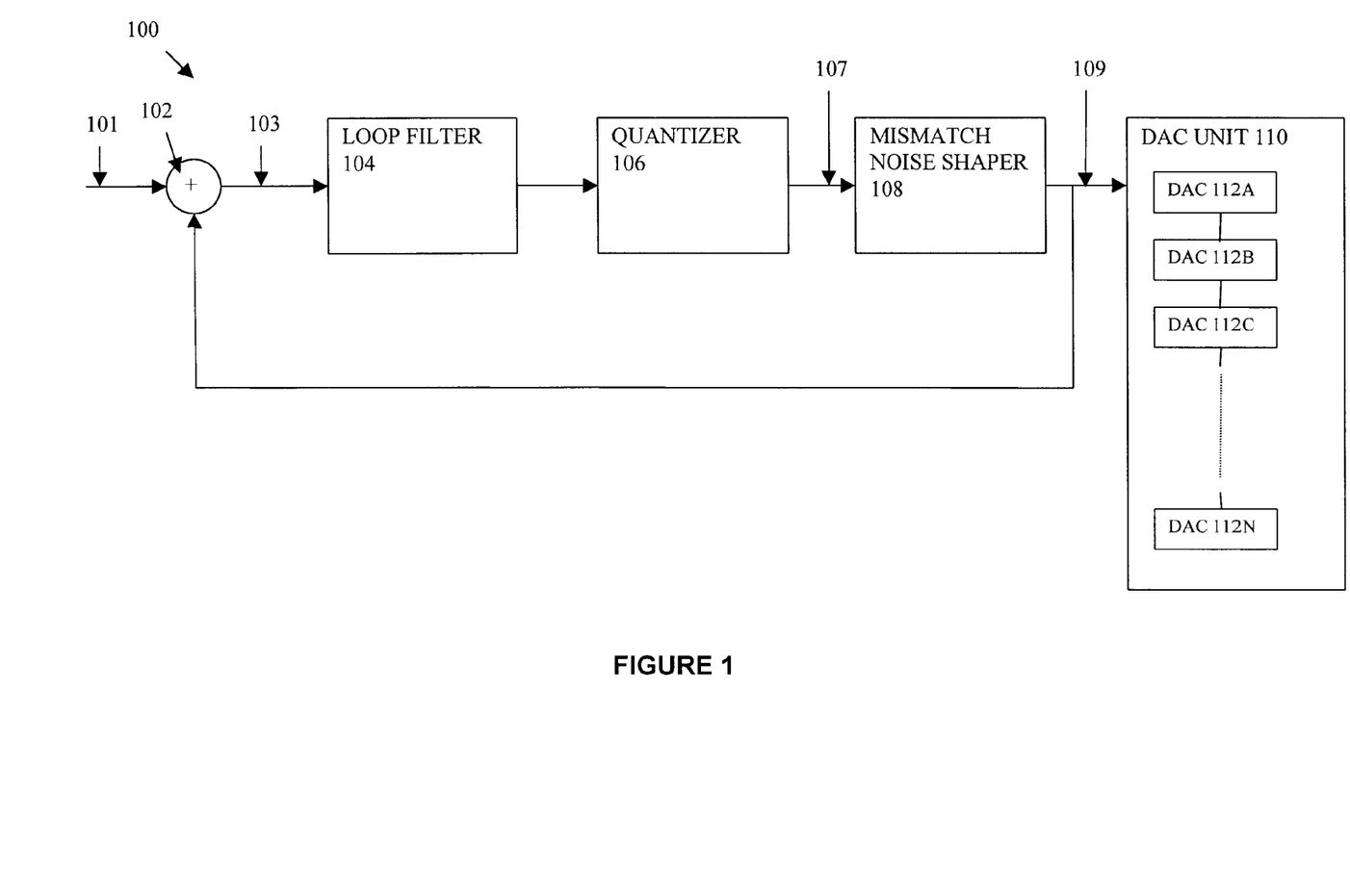
FIG. 1 is a block diagram of an exemplary delta-sigma modulator having a mismatch noise shaper integrated into the main loop in accordance with the present invention.

With reference now to FIG. 1, a block diagram of an exemplary delta-sigma modulator 100 having a mismatch noise shaper 108 integrated into the main loop in accordance with the present invention is shown. Delta-sigma modulator 100 has a summer 102, a loop filter 104, a quantizer 106, and a mismatch noise shaper 108 coupled together in series as shown in FIG. 1. Summer 102 receives as its inputs an input signal 101 and a feedback signal, which is an output signal 109 from mismatch shaper 108. Summer 102 determines and outputs a difference or error signal 103 between input signal 101 and output signal 109.

Loop filter 104 receives difference or error signal 103 from the output of summer 102. Loop filter 104 filters difference or error signal 103 and outputs the filtered signal to quantizer 106. Quantizer 106 digitizes the filtered signal and provides a digital output signal 107 to mismatch noise shaper 108. Mismatch noise shaper 108 receives as its input digital output signal 107 from quantizer 106. Mismatch noise shaper 108 accordingly provides output signal 109. As stated earlier, output signal 109 from mismatch noise shaper 108 is fed back to summer 102. Output signal 109 is also fed into a digital-to-analog converter ("DAC") unit 110. DAC unit 110 has various DAC elements 112A, 112B, 112C, . . . 112N. Output signal 109 provides an output value to DAC unit 110, which, in turn, determines and controls how DAC elements 112A, 112B, 112C, . . . 112N are to be used and what respective bit values are to be assigned to each of DAC elements 112A, 112B, 112C, . . . 112N.

Figure 2:
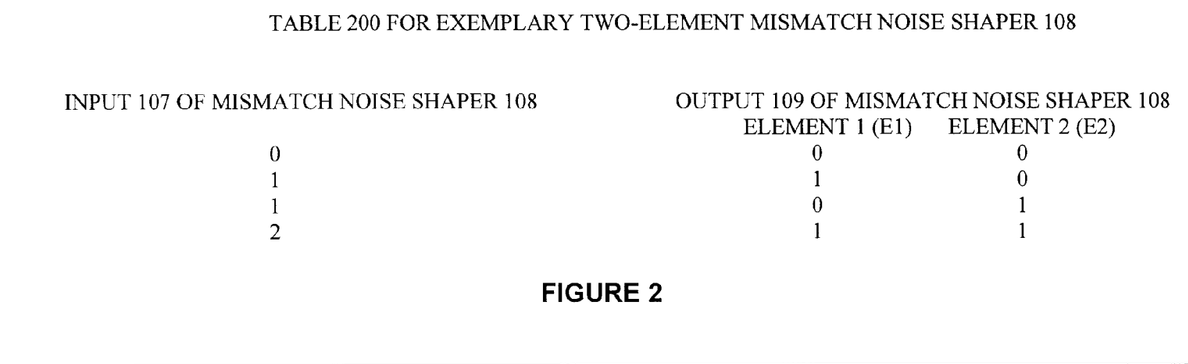
FIG. 2 is a table of input and output values for an exemplary two-element mismatch noise shaper in accordance with the present invention.

Referring now to FIG. 2, a table 200 of input and output values for an exemplary two-element mismatch noise shaper 108 (e.g., quantizer has three quantization levels and mismatch noise shaper 108 shapes mismatched element usage for the three quantization levels) in accordance with the present invention is shown. For this example, delta-sigma modulator 100 of FIG. 1 would have a DAC unit 110 with only two DAC elements 112A and 112B. Mismatch noise shaper 108 would still receive the output signal from quantizer 106. Mismatch noise shaper 108 would also output a value for DAC element 112A (e.g., element 1) and another value for DAC element 112B (e.g., element 2).

In table 200, if input 107 of mismatch noise shaper 108 is zero (0), then output 109 of mismatch noise shaper 108 is zero (0) for element 1 and zero (0) for element 2. In this case, mismatch noise shaper 108 is not able to control usage and bit values for elements 1 and 2 since both of their values have to be zero (0). Similarly, if input 107 of mismatch noise shaper 108 is two (2), then output 109 of mismatch noise shaper 108 is one (1) for element 1 and one (1) for element 2. In this similar situation, mismatch noise shaper is also not able to shape mismatch noise and control usage and bit values for elements 1 and 2 since both of their values have to be one (1).

In an exemplary two-element mismatch noise shaper 108, the only scenario that exists for mismatch noise shaper 108 to be able to shape mismatch noise is when input 107 is equal to one (1). In this case, either output 109 will be one (1) for element 1 and zero (0) for element 0 or will be zero (0) for element 1 and one (1) for element 1. Mismatch noise shaper 108 then makes a decision as to which element will have which value.

However, if output 109 maintains a value of either zero (0) or two (2) for a duration of time, then the effect of mismatch noise shaper 108 is negated. Mismatch noise shaper 108 is not able to make a decision and control selection of and values for elements to shape mismatch noise when output 109 is either zero (0) or two (2) for a period of time. Thus, the operation of mismatch noise shaper 108 is, in effect, negated. In order to overcome this negative effect, mismatch noise shaper 108 overrides the output of quantizer 106 (e.g., input 107 of mismatch shaper 108) so that the output of mismatch shaper 108 differs from the output of quantizer 106. Mismatch noise shaper 108 overrides quantizer 106 when the output of quantizer 106 has prevented the output of mismatch noise shaper 108 from controlling selection of and values for elements for a pre-determined time period.

Figure 3A:
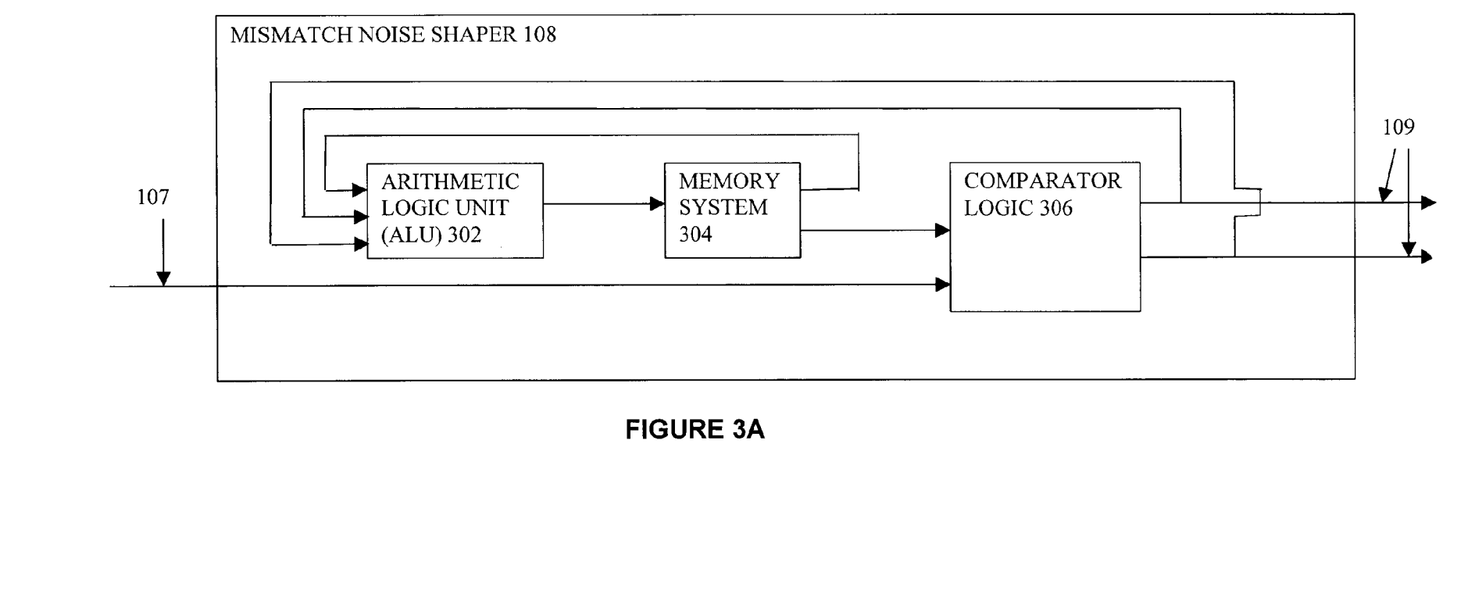
FIG. 3A is a block diagram of an exemplary mismatch noise shaper showing the main operational components according to the present invention.

With reference now to FIG. 3A, a block diagram of an exemplary mismatch noise shaper 108 showing the main operational components according to the present invention is shown and now explained. The operational high-level block diagram shows mismatch noise shaper 108 with an arithmetic logic unit ("ALU") 302, a memory system 304, and comparator logic 306 coupled together in series. The output of ALU 302 is fed into the input of memory system 306, and the output of memory system 304 is, in turn, fed into the input of comparator logic 306. Comparator logic 306 also receives input 107 as another input signal. Comparator logic 306 further provides output 109. Output of memory system 304 is fed back to another input of ALU 302, and output 109 of comparator logic 306 is also fed back to a further input of ALU 302.

Memory system 304 may receive and store the current value of input signal 107. Also, memory system 304 may store a counter that tracks various time cycles. The counter starts when a value of input signal 107 is first received, and the counter resets when the value of input signal 107 changes or when mismatch noise shaper 108 overrides quantizer 106. Thus, one implementation for mismatch noise shaper 108 involves comparator logic 306 determining whether input signal 107 has maintained a particular value for a pre-determined period of time by utilizing the counter.

Another implementation involves the use of a state variable(s). Comparator logic 306 may determine a value(s) for the state variable(s) of mismatch noise shaper 108. The state variable(s) has a value(s) of a certain limit(s) that when reached, mismatch noise shaper 108 selectively overrides quantizer 106. The certain limit is defined by the output of quantizer 106 (e.g., input 107 into mismatch noise shaper 108) continuously maintaining one or more values that prevent mismatch noise shaper 108 from controlling selection of elements (e.g., DAC elements 112A, 112B, 112C . . .

112N) for the pre-determined time period. Therefore, decisions of delta-sigma modulator 100 of FIG. 1 are slightly compromised by mismatch noise shaper 108 overriding quantizer 106 in order to improve the operation of mismatch noise shaper 108. In other words, the noise shaping operation by delta-sigma modulator 100 through quantizer 106 may be slightly sacrificed in exchange for better performance for mismatch noise shaper 108.

Figure 3B:
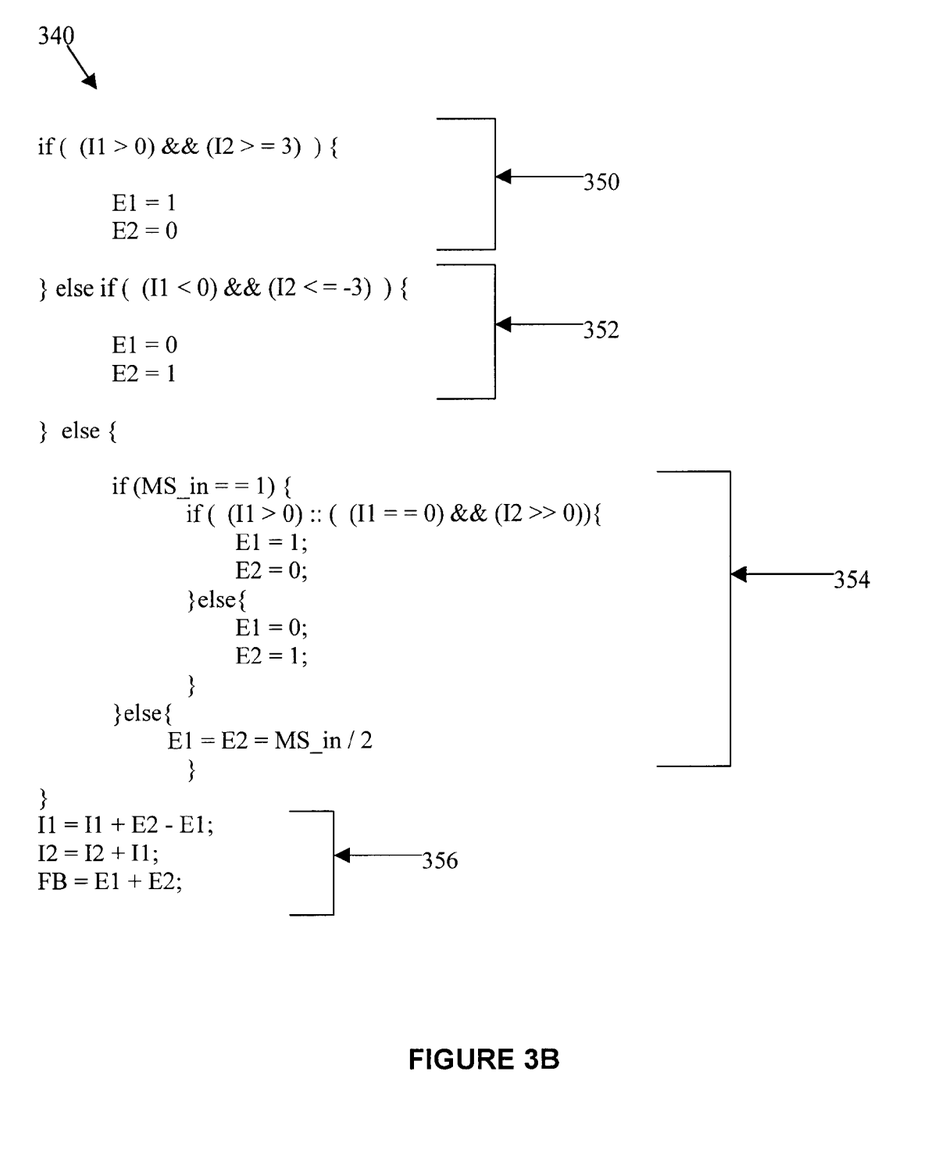
FIG. 3B is exemplary pseudo-code algorithm implemented and executed by the exemplary mismatch noise shaper of FIG. 3A according to the present invention.

Referring now to FIG. 3B, an exemplary pseudo-code algorithm 340 which exemplary mismatch noise shaper 108 of FIG. 3A implements and executes according to the present invention is shown. Exemplary state variables for mismatch noise shaper 108 are defined as I1 and I2. State variables I1 and I2 may be integral state variables provided by integrators of mismatch noise shaper 108. For example, I1 and I2 represent the first and second integrals of the usage of elements 1 and 2. Mismatch noise shaper 108 shapes the mismatch noise to the second order by driving both integrals to zero. A second order modulator is preferred for the mismatch noise shaping since a first order modulator system is usually insufficient and often tonal. Typically, higher order mismatch shaping modulators are difficult to implement due to stability issues. The techniques disclosed by the present invention allow higher order modulators to be realistically implemented without stability issues. State variables I1 and I2 are stored into memory system 304. In pseudo-code algorithm 340, E1 represents element 1, and E2 represents element 2, which are the elements 1 and 2 in table 200 of FIG. 2. Values for input 107 and E1 and E2 of output 109, such as exemplary values in table 200 of FIG. 2, may be provided by mismatch noise shaper 108 through hardwiring the values in comparator logic 306. FB represents the feedback value of both E1 and E2 summed together that is fed back from comparator logic 306 into ALU 302. "MS_in" represents the value of input 107 for mismatch noise shaper 108.

Pseudo-code algorithm 340 starts with code portion 350. Code portion 350 reflects a condition in which comparator logic 306 determines whether one of the certain limits (e.g., an upper limit) of the state variables has been reached. In this example, the upper limit condition is represented by I1>0 and I2>3. When such a condition occurs, comparator logic 306 overrides the output of quantizer 106 and sets E1=1 and E2=0 for output 109. Pseudo-code algorithm 340 next moves to code portion 352. Code portion 352 represents a situation in which comparator logic 306 determines whether another one of the certain limits (e.g., a lower limit) of the state variables has been reached. In this example, the lower limit condition is identified by when I1<0 and I2<−3. When such a lower limit has been reached, comparator logic 306 overrides the output of quantizer 106 and sets E1=0 and E2=1 for output 109.

If a certain limit (e.g., either upper or lower limit) has not been reached, then pseudo-code algorithm 340 proceeds to code portion 354. Code portion 354 represents comparator logic 306 determining that a certain limit (e.g., either upper or lower limit) has not been reached, and comparator logic 306 does not override the output of quantizer 106. In this case, comparator logic 306 executes pseudo-code algorithm 340 according to typical operations and mismatch noise shaping operation for delta-sigma modulator 100. More specifically, code portion 354 reflects compartor logic 306 determining whether MS_in=1. If so, then comparator logic 306 makes decisions to shape mismatch noise for delta-sigma modulator 100 according to typical mismatch noise shaping operation. Code portion 354 illustrates that if MS_in=1 and I1=0 and I2>0, then comparator logic 306 shapes mismatch noise by setting E1=1 and E2=0 for output 109. Otherwise, comparator logic 306 sets E1=0 and E2=1 for output 109 in shaping the mismatch noise.

On the other hand, if comparator logic 306 determines that MS_in does not equal 1 (e.g., equals 0 or 2), then E1 is set equal to E2, which is set equal to MS_in divided by 2. In this scenario, comparator logic 306 simply directs the value of output 109 of mismatch noise shaper 108 to simply follow the value of the output (e.g., input 107) of quantizer 106.

Pseudo-code algorithm 340 then moves to code portion 356. Code portion 356 reflects the updating of the state variables, which ALU 302 executes. ALU 302 updates the state variables by setting the new value of I1 equal to the value of E1 subtracted from the sum of the old value of I1 and the current value of E2. ALU 302 also sets the new value of I2 equal to the old value of I2 and the new value of I1. ALU 302 also calculates the new value of FB by summing together the current values of E1 and E2 that are received by ALU 302 from comparator logic 306.

Figure 4:
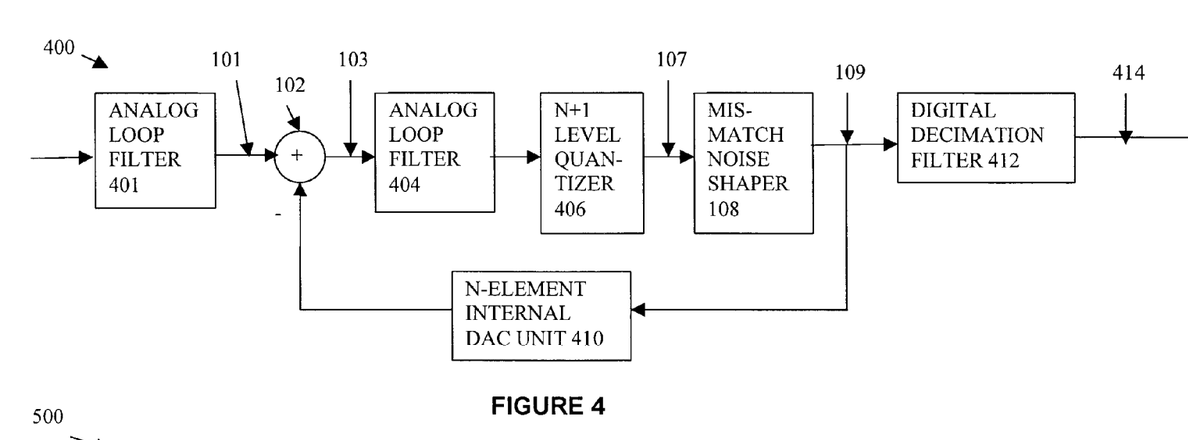
FIG. 4 is a block diagram of an exemplary analog-to-digital converter ("ADC") which embodies the mismatch noise shaper in the main loop of the delta-sigma modulator in accordance with the present invention.

With reference now to FIG. 4, a block diagram of an exemplary analog-to-digital converter ("ADC") 400 which embodies mismatch noise shaper 108 in the main loop of a delta-sigma modulator for ADC 400 in accordance with the present invention is shown. The delta-sigma modulator includes summer 102, analog loop filter 404 as loop filter 104, N+1-level quantizer 406 (where N is greater than 1) as quantizer 106, mismatch noise shaper 108 coupled together in series as shown in FIG. 4. An internal N-element DAC unit 410 is further coupled in a feedback loop between output 109 of mismatch noise shaper 108 and summer 102. DAC elements are part of N-element internal DAC unit 410. An analog loop filter 401 is coupled in line with input signal 101 of summer 102. Summer 102 outputs difference or error signal 103, which is the difference between input signal 101 and the output feedback signal from N-bit internal DAC unit 410. A digital decimation filter 412 is coupled to output 109 of mismatch noise shaper 108 for providing a digital output value 414, which is converted by ADC 400 from input signal 101.

Figure 5:
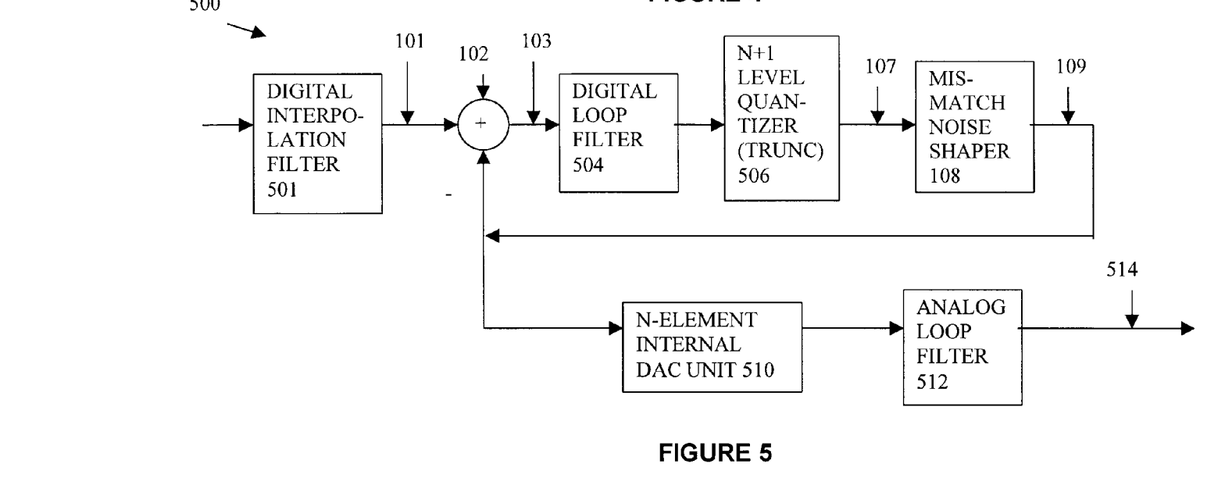
FIG. 5 is a block diagram of an exemplary digital-to-analog converter ("DAC") which embodies the mismatch noise shaper in the main loop of the delta-sigma modulator in accordance with the present invention.

Referring now to FIG. 5, a block diagram of an exemplary digital-to-analog converter ("DAC") 500 which embodies mismatch noise shaper 108 in the main loop of a delta-sigma modulator for DAC 500 in accordance with the present invention is shown. The delta-sigma modulator includes summer 102, digital loop filter 504 as loop filter 104, truncating N+1 level quantizer 506 (where N is greater than 1) as quantizer 106, mismatch noise shaper 108 coupled together in series as shown in FIG. 5. Output 109 of mismatch noise shaper 108 is fed back to summer 102. A digital interpolation filter 501 is coupled in line with input signal 101. Summer 102 receives input 101 and further receives output 109 from mismatch noise shaper 108, which is the feedback signal from N-element internal DAC unit 510. Summer 102 outputs difference or error signal 103, which is the difference between input signal 101 and output 109. Also, an internal DAC unit 510 is further coupled to receive output 109 of mismatch noise shaper 108. DAC elements are part of N-element internal DAC unit 510. An analog low pass filter 512 is coupled to the output of N-bit internal DAC unit 510 and removes out of band noise. Analog low pass filter provides an analog output signal 514, which is converted by DAC 500 from input signal 101.

Figure 6:
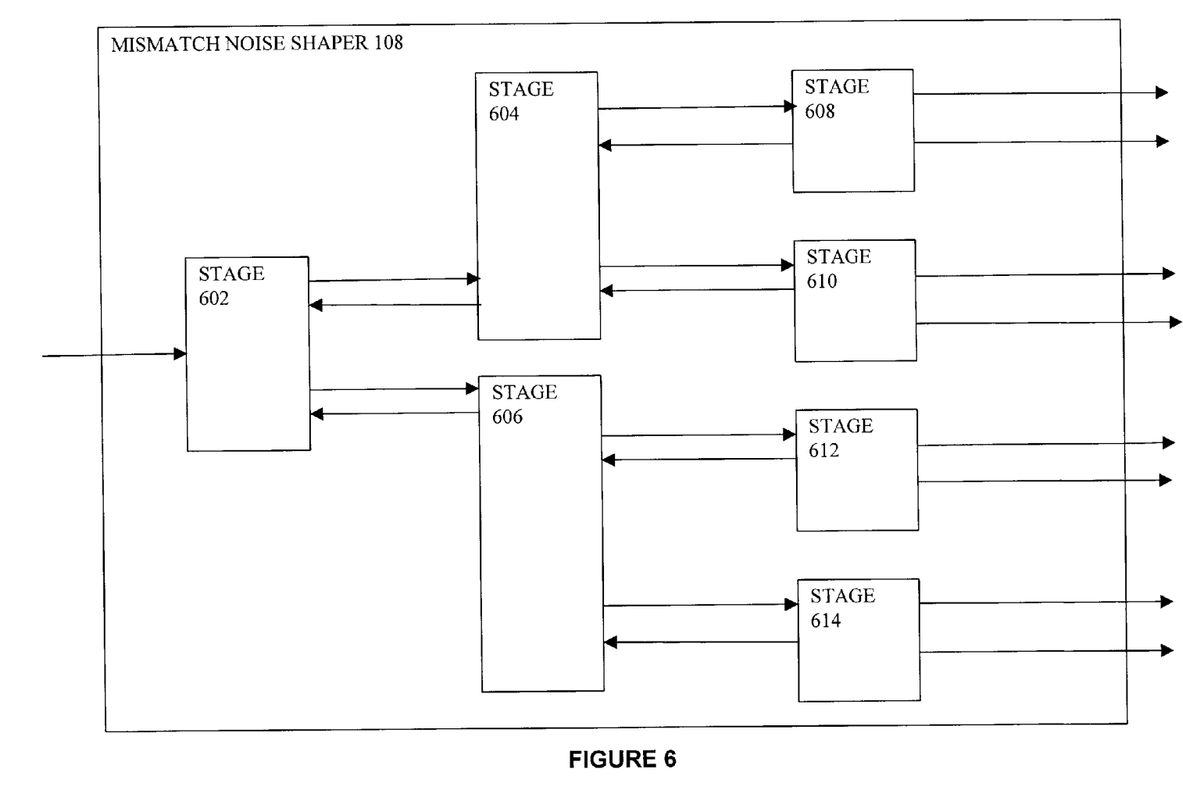
FIG. 6 is a block diagram of an exemplary mismatch noise shaper according to the present invention in which the mismatch noise shaper has multiple stages.

With reference now to FIG. 6, a block diagram of an exemplary mismatch noise shaper 108 having multiple stages in accordance with the present invention is shown.

FIG. 6 shows that exemplary mismatch noise shaper 108 has multiple stages 602, 604, 606, 608, 610, 612, and 614. The early stage 602 has one of its output fed into stage 604 and another of its output fed into stage 606. Stage 604, in turn, has one of its output fed into stage 608 and another output fed into stage 610. Furthermore, stage 606 has one of its output fed into stage 612 and another output fed into stage 614. Stages 608, 610, 612, and 614 each has two outputs, and these stages provide a total of eight outputs for eight respective elements (e.g., eight DAC elements).

Exemplary mismatch noise shaper 108 further provides feedback from the later stages to the earlier stages. For example, stages 608 and 610 provide feedback to stage 604, and stages 612 and 614 provide feedback to stage 606. Also, stages 604 and 606 provide feedback to stage 602. The feedback provides information to earlier stages to determine or indicate whether the output of quantizer 106 should be overridden depending upon states of the stages. Mismatch noise shaper 108 may be configured so that earlier stages (e.g., stages 602, 604, and 606) make decisions biased upon the states of later stages (e.g., stages 608, 610, 612, and 614).

The present invention provides a method and system for integrating a mismatch noise shaper into the main loop of a delta-sigma modulator. The present invention feeds the output of the mismatch noise shaper back to the summer of the delta-sigma modulator. The present invention allows the mismatch noise shaper to selectively override the quantizer at appropriate times so that the output of the noise shaper differs from an output of the quantizer. The present invention allows the mismatch noise shaper to selectively override the quantizer when the output of the quantizer has prevented the mismatch noise shaper to control selection of elements at the output of the mismatch noise shaper for a pre-determined time period.

Although the invention has been described with reference to a specific embodiment(s), these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A delta-sigma modulator, comprising:
a digital summer for receiving both an a digital input signal and a feedback signal to determine a difference signal, a loop filter for filtering the difference signal, a quantizer for quantizing the filtered signal, and a mismatch noise shaper for matching element usage at a digital output of the delta-sigma modulator wherein the summer, the loop filter, the quantizer, and the mismatch noise shaper are coupled together; and
wherein the feedback signal is responsive to the mismatch noise shaper.

2. The delta-sigma modulator according to claim 1, wherein the mismatch noise shaper selectively overrides the quantizer so that the mismatch noise shaper changes output values of the mismatch noise shaper from values representative of a corresponding output value of the quantizer to other values representative of a different output value of the quantizer.

3. The delta-sigma modulator according to claim 2, wherein the mismatch noise shaper selectively overrides the quantizer when the output of the quantizer has prevented the mismatch noise shaper to control selection of elements at the output of the mismatch noise shaper for a pre-determined time period.

4. The delta-sigma modulator according to claim 2, wherein the mismatch noise shaper selectively overrides the quantizer when a state variable of the mismatch noise shaper has reached a certain limit.

5. The delta-sigma modulator according to claim 2, wherein the mismatch noise shaper is a second or higher order delta-sigma modulator.

6. The delta-sigma modulator according to claim 1, wherein the quantizer is a multi-bit quantizer.

7. The delta-sigma modulator according to claim 1, wherein the mismatch noise shaper has multiple stages in which earlier stages make decisions biased by states of later stages.

8. The delta-sigma modulator according to claim 1, wherein decisions of the delta-sigma modulator are slightly compromised by the mismatch noise shaper overriding the quantizer in order to improve operation of the mismatch noise shaper.

9. The delta-sigma modulator according to claim 1, wherein the mismatch noise shaper is a second or higher order delta-sigma modulator.

10. A method for delta-sigma modulating a signal, comprising:
receiving, by a digital summer, both an a digital input signal and a feedback signal and determining, by the digital summer, a difference signal,
filtering, by a loop filter, the difference signal,
quantizing, by a quantizer, the filtered signal,
shaping, by the mismatch noise shaper, mismatched element usage, and
feeding back a digital output of the mismatch noise shaper as the feedback signal to the digital summer so that the feedback signal is responsive to the mismatch noise shaper.

11. The method according to claim 10, wherein shaping, by the mismatch noise shaper, mismatched element usage further comprises:
selectively overriding, by the mismatch noise shaper, the quantizer so that the mismatch noise shaper changes output values of the mismatch noise shaper from values representative of a corresponding output value of the quantizer to other values representative of a different output value of the quantizer.

12. The method according to claim 11, wherein selectively overriding further comprises:
selectively overriding, by the mismatch noise shaper, the quantizer when the output of the quantizer has prevented the mismatch noise shaper to control selection of elements at the output of the mismatch noise shaper for a pre-determined time period.

13. The method according to claim 11, wherein selectively overriding further comprises:
selectively overriding, by the mismatch noise shaper, the quantizer when a state variable of the mismatch noise shaper has reached a certain limit.

14. The method according to claim 10, wherein the mismatch noise shaper has multiple stages and further comprising:
biasing decisions made by earlier stages by states of later stages.

15. The method according to claim 10, further comprising:
slightly compromising decisions of the delta-sigma modulator by the mismatch noise shaper overriding the quantizer in order to improve operation of the mismatch noise shaper.

16. An analog-to-digital converter (ADC), comprising:
a delta-sigma modulator having coupled together a summer for receiving both an input signal and a feedback signal to determine a difference signal, an analog loop filter for filtering the difference signal, an N+1 level quantizer for quantizing the filtered signal, and a mismatch noise shaper for matching element usage at an output of the delta-sigma modulator that is fed back towards the summer for providing the feedback signal that is responsive to the mismatch noise shaper;
an N-element internal digital-to-analog converter (DAC) unit having an N number of DAC elements wherein the DAC unit is coupled in a feedback loop between the output of the mismatch noise shaper and the summer;
another analog loop filter coupled in line with the Input signal of the summer; and
a digital decimation filter coupled to the output of the mismatch noise shaper for providing a digital output value; and
wherein the mismatch noise sharer selectively overrides the N+1 level quantizer so that the mismatch noise shaper changes output values of the mismatch noise shaper from values representative of a corresponding output value of the N+1 level quantizer to other values representative of a different output value of the N+1 level quantizer.

17. The ADC according to claim 16, wherein the mismatch noise shaper selectively overrides the N+1 level quantizer when the output of the N+1 level quantizer has prevented the mismatch noise shaper to control selection of the DAC elements at the output of the mismatch noise shaper for a pre-determined time period.

18. The ADC according to claim 16, wherein the mismatch noise shaper selectively overrides the N+1 level quantizer when a state variable of the mismatch noise shaper has reached a certain limit.

19. The ADC according to claim 16, wherein the mismatch noise shaper has multiple stages in which earlier stages make decisions biased by states of later stages.

20. The ADC according to claim 16, wherein decisions of the delta-sigma modulator are slightly compromised by the mismatch noise shaper overriding the N+1 level quantizer in order to improve operation of the mismatch noise shaper.

21. A digital-to-analog converter (DAC), comprising:
a delta-sigma modulator having coupled together a digital summer for receiving both a digital input signal and a feedback signal to determine a difference signal, a digital loop filter for filtering the difference signal, an N+1 level quantizer for quantizing the filtered signal, and a mismatch noise shaper for matching element usage at a digital output of the delta-sigma modulator that is fed back to the digital summer as the feedback signal so that the feedback signal is responsive to the mismatch noise shaper;
an N-element internal digital-to-analog converter (DAC) unit with an N number of DAC elements wherein the DAC unit is coupled to an output of the mismatch noise shaper;
a digital interpolation filter coupled in line with the input signal of the digital summer; and
an analog loop filter coupled to an output of the N-element DAC unit.

22. The DAC according to claim 21, wherein the mismatch noise shaper selectively overrides the N+1 level quantizer so that the mismatch noise shaper changes output values of the mismatch noise shaper from values representative of a corresponding output value of the N+1 level quantizer to other values representative of a different output value of the N+1 level quantizer.

23. The DAC according to claim 22, wherein the mismatch noise shaper selectively overrides the N+1 level quantizer when the output of the N+1 level quantizer has prevented the mismatch noise shaper to control selection of the DAC elements at the output of the mismatch noise shaper for a predetermined time period.

24. The DAC according to claim 22, wherein the mismatch noise shaper selectively overrides the N+1 level quantizer when a state variable of the mismatch noise shaper has reached a certain limit.

25. The DAC according to claim 21, wherein the mismatch noise shaper has multiple stages in which earlier stages make decisions biased by states of later stages.

26. The DAC according to claim 21, wherein decisions of the delta-sigma modulator are slightly compromised by the mismatch noise shaper overriding the N+1 level quantizer in order to improve operation of the mismatch noise shaper.

27. A delta-sigma modulator, comprising:
a summer for receiving both an input signal and a feedback signal to determine a difference signal, a loop filter for filtering the difference signal, a quantizer for quantizing the filtered signal, and a mismatch noise shaper for matching element usage at an output of the delta-sigma modulator wherein the summer, the loop filter, the quantizer, and the mismatch noise shaper are coupled together; and
wherein the feedback signal is responsive to the mismatch noise sharer; and
wherein the mismatch noise shaper selectively overrides the quantizer so that the mismatch noise shaper changes output values of the mismatch noise shaper from values representative of a corresponding value of the quantizer to other values representative of a different output value of the quantizer.

28. The delta-sigma modulator according to claim 27, wherein the mismatch noise shaper selectively overrides the quantizer when the output of the quantizer has prevented the mismatch noise shaper to control selection of elements at the output of the mismatch noise shaper for a pre-determined time period.

29. The delta-sigma modulator according to claim 27, wherein the mismatch noise shaper selectively overrides the quantizer when a state variable of the mismatch noise shaper has reached a certain limit.

30. A method for delta-sigma modulating a signal, comprising:
receiving, by a summer, both an input signal and a feedback signal and determining, by the summer, a difference signal,
filtering, by a loop filter, the difference signal, quantizing, by a quantizer, the filtered signal,
shaping, by the mismatch noise shaper, mismatched element usage,
feeding back an output of the mismatch noise shaper as the feedback signal to the summer so that the feedback signal is responsive to the mismatch noise shaper, and
selectively overriding, by the mismatch noise shaper, the quantizer so that the mismatch noise shaper changes output values of the mismatch noise shaper from values representative of a corresponding output value of the quantizer to other values representative of a different output value of the quantizer.

31. The method according to claim 30, where in selectively overriding further comprises:

selectively overriding, by the mismatch noise shaper, the quantizer when the output of the quantizer has prevented the mismatch noise shaper to control selection of elements at the output of the mismatch noise shaper for a pre-determined time period.

32. The method according to claim 30, wherein selectively overriding further comprises:

selectively overriding, by the mismatch noise shaper, the quantizer when a state variable of the mismatch noise shaper has reached a certain limit.

* * * * *